US009103657B2

(12) United States Patent
Ruigrok et al.

(10) Patent No.: US 9,103,657 B2
(45) Date of Patent: Aug. 11, 2015

(54) MAGNETIC FIELD SENSOR SYSTEM WITH A BIASING MAGNET PRODUCING A SPATIALLY SYMMETRIC MAGNETIC FIELD WITHIN A PLANE BEING DEFINED BY MAGNETORESISTIVE SENSOR ELEMENTS

(71) Applicant: NXP B.V., Eindhoven (NL)

(72) Inventors: Jacobus Josephus Maria Ruigrok, Asten (NL); Alexe Levan Nazarian, Eindhoven (NL); Frederik Willem Maurits Vanhelmont, Maaseik (BE)

(73) Assignee: NXP B.V., Eindhoven (NL)

( * ) Notice: Subject to any disclaimer, the term of this patent is extended or adjusted under 35 U.S.C. 154(b) by 20 days.

(21) Appl. No.: 14/017,453

(22) Filed: Sep. 4, 2013

(65) Prior Publication Data
US 2014/0084906 A1 Mar. 27, 2014

(30) Foreign Application Priority Data

Sep. 26, 2012 (EP) .................................... 12186184

(51) Int. Cl.
*G01B 7/30* (2006.01)
*G01R 33/02* (2006.01)
*G01D 5/14* (2006.01)
*G01R 33/00* (2006.01)
*G01R 33/09* (2006.01)

(52) U.S. Cl.
CPC *G01B 7/30* (2013.01); *G01D 5/145* (2013.01); *G01D 5/147* (2013.01); *G01R 33/0011* (2013.01); *G01R 33/091* (2013.01)

(58) Field of Classification Search
CPC ......... G01D 5/145; G01D 5/147; G01R 33/09

USPC ................................. 324/207.21, 207.25, 252
See application file for complete search history.

(56) References Cited

U.S. PATENT DOCUMENTS

| 5,359,287 | A | 10/1994 | Watanabe et al. |
| 5,585,719 | A * | 12/1996 | Endo et al. .................... 324/235 |
| 5,781,005 | A | 7/1998 | Vig et al. |
| 7,141,967 | B2 | 11/2006 | Butzmann |
| 2008/0116884 | A1 | 5/2008 | Rettig et al. |

FOREIGN PATENT DOCUMENTS

DE 10 2004 06353 A1 9/2005
DE 10 2007 02596 A1 12/2008

OTHER PUBLICATIONS

Extended European Search Report for EP Patent Appln. No. 12186184.3 (Mar. 27, 2013).

* cited by examiner

*Primary Examiner* — Reena Aurora (57) ABSTRACT

A magnetic field sensor system for measuring rotational movements of a shaft is disclosed. The sensor system includes a biasing magnet configured for generating a biasing magnetic field and a magnetic wheel having a wheel axis and a circumferential surface which comprises a regular structure of teeth and gaps arranged in an alternating manner. The magnetic wheel is attachable to the shaft and is magnetizable by the biasing magnetic field. A magnetoresistive sensor arrangement comprising four magnetoresistive sensor elements being connected with each other in a Wheatstone bridge, respectively two of the magnetoresistive sensor elements being assigned to one half bridge of the Wheatstone bridge. The four magnetoresistive sensor elements are arranged within an x-y plane.

16 Claims, 6 Drawing Sheets

MAGNETIC FIELD SENSOR SYSTEM WITH A BIASING MAGNET PRODUCING A SPATIALLY SYMMETRIC MAGNETIC FIELD WITHIN A PLANE BEING DEFINED BY MAGNETORESISTIVE SENSOR ELEMENTS

CROSS-REFERENCE TO RELATED APPLICATIONS

This application claims the priority under 35 U.S.C. §119 of European patent application no. 12186184.3, filed on Sept. 26, 2012, the contents of which are incorporated by reference herein.

FIELD OF THE INVENTION

The present invention generally relates to the technical field of magnetic field sensors. In particular, the present invention relates to a magnetic field sensor system comprising a biasing magnet, and encoded soft magnetic wheel having a teeth structure and magnetoresistive sensor elements, which with the help of an appropriate evaluation electronic are capable of determining positional information of the encoded soft-magnetic element.

BACKGROUND OF THE INVENTION

Magnetic sensors are increasingly important in various industries. For instance in the automotive industry various sensors such as parking sensors, angular sensors e.g. in throttle valves, ABS (Automatic Braking System) sensors and tire pressure sensors can be found in modern vehicles for improving comfort and safety. Magnetic sensors are particularly important in automotive applications, because magnetic fields penetrate easily through most materials. Magnetic sensors are also highly insensitive to dirt, unlike for example optical sensors.

Several different magnetic sensor technologies are currently available, such as magneto transistors (MT), sensors based on the Hall Effect and sensors based on the magnetoresistive effect such as anisotropic magnetoresistive (AMR) and giant magnetoresistive (GMR) sensors. The sensing principle of AMR sensors is based on the physical phenomenon that the electric resistance of a ferromagnetic material depends on the angle between the magnetization and the direction of the electric current within an AMR sensing element. Hall sensors and MTs, which rely on the Lorentz force, have a comparatively low sensitivity and consequently also a low accuracy. AMR sensors, while having a much higher sensitivity compared to Hall effect sensors and MTs, require more fabrication steps because they cannot easily be integrated monolithically, making a total sensor system ore expensive.

GMR sensors typically have a higher sensitivity than AMR sensors. However, a GMR sensor consists of various thin layers and critical interfaces. The technology required to fabricate such sensors in considerably more complicated and expensive. Furthermore, due to the thin multiple layers making up a GMR sensor, the operating temperature range is also limited. Therefore often AMR sensors are chosen as a good compromise in magnetic sensor applications.

U.S. Pat. No. 7,141,967 B2 discloses a magnetic field sensor system for measuring the angular speed of a soft magnetic (gear) wheel attached for instance to the axis of a camshaft or crankshaft in a transmission system of a combustion engine. The disclosed magnetic field sensor system comprises a MR sensor arrangement consisting of four MR sensor elements which are electrically connected with each other in a so called Wheatstone bridge. The magnetic field sensor system further comprises a hard magnetic (permanent) magnet that produces a biasing magnetic field which magnetizes the wheel. In this respect soft magnetic means that the wheel has a high magnetic permeability and hard magnetic means that the magnet can be permanently magnetized. The hard magnet is predominantly magnetized in a radial z-direction being oriented perpendicular to an x-y plane in which the four sensor elements are arranged. A periodic teeth-gap structure of the soft magnetic wheel produces periodic magnetic field changes when the wheel rotates, which are mainly visible in the y- and z-components of the magnetic field. Since the MR sensor arrangement is sensitive to the y-component (Hy) of the magnetic field (H), this periodicity is visible in the output of the magnetic field sensor system. This signal can be used for determining the position and speed of the (gear) wheel and therefore of the parts of e.g. an engine to which the magnetic (gear) wheel is mechanically connected. The known magnetic field sensor system has the disadvantage that external magnetic field may have a negative impact on the sensitivity and on the reliability of the magnetic field sensor system. Such a negative impact may in particular occur when the magnetic field sensor system is used for determining the position and/or the speed of a crankshaft sensor because the starter motor in a start-stop system is typically located in the neighborhood of the crankshaft.

There may be a need for providing an MR sensor concept which on the other hand has a high sensitivity and on the other hand exhibits a high immunity with respect to external magnetic fields.

OBJECT AND SUMMARY OF THE INVENTION

This need may be met by the subject matter according to the independent claim. Advantageous embodiments of the present invention are described by the dependent claims.

According to a first aspect of the invention there is provided a magnetic field sensor system for measuring rotational movements of a shaft. The provided magnetic field sensor system comprises (a) a biasing magnet configured for generating a biasing magnetic field; (b) a magnetic wheel having a wheel axis and a circumferential surface which comprises a regular structure of teeth and gaps arranged in an alternating manner, wherein (b1) the magnetic wheel is attachable to the shaft and (b2) the magnetic wheel can be magnetized by the biasing magnetic field; and (c) a magnetoresistive sensor arrangement comprising four magnetoresistive sensor elements being connected with each other in a Wheatstone bridge. Respectively two of the magnetoresistive sensor elements are assigned to one half bridge of the Wheatstone bridge. The four magnetoresistive sensor elements are arranged within an x-y plane, wherein an x-axis, a y-axis and a z-axis define an orthogonal Cartesian coordinate system in which (i) the x-axis is oriented parallel with the wheel axis of the magnetic wheel, (ii) the y-axis is oriented tangential to the circumferential surface of the magnetic wheel, and (iii) the z-axis is the symmetry line through the center of the biasing magnet and the center of the magnetic wheel. Further, the biasing magnet is configured in such a manner that the y-component of the biasing magnetic field is symmetric with respect to the y=0 plane.

The described magnetic field sensor system is based on the idea that a particular symmetry of the biasing magnetic field produced by the biasing magnet of the sensor system enables absolute position detection in a convenient way. When the magnetoresistive sensor elements are arranged within the x-y plane as defined above, this biasing magnetic field symmetry can be descriptively described as follows: In the absence of the magnetic wheel the y-component of the biasing magnetic field within any arbitrary x-y plane is symmetric with respect to the plane being defined by y=0. In a more mathematical expression: Hy0(−y)=Hy0(y). As a consequence, Hz0(y), which is the z-component of the biasing magnetic field within the x-y plane, will be anti-symmetric with respect to the y=0 plane.

The described symmetry of the biasing magnetic field can be realized e.g. by a class of various permanent magnet (PM) arrangements or designs. Thereby, a single monolithically or integrally formed PM or a combination of different PMs can be used. Independent from the specific PM design which results in the above defined symmetry of the biasing magnetic field, the described magnetic field sensor system can lead to a differential output of the Wheatstone bridge with zeros at fixed wheel positions independent of the mounting distance and independent of any uniform external magnetic stray field in the x-direction or in the y-direction. In this respect it is mentioned that external magnetic (stray) fields in the z direction should be avoided or should at least be relatively small compared to the desired field in the y-direction, because stray fields in the z-direction may disturb the desired field symmetry, at least in the presence of a toothed magnetic wheel, and therefore cause the zero output positions to shift away from the fixed symmetric wheel positions.

The described magnetic field sensor concept has the advantage that it works for any differential magnetic sensor having a large sensitivity in the x-y plane. Hence, like for anisotropic magnetoresistive (AMR) sensors, it also leads to convenient options for giant magnetoresistive (GMR) sensors, tunnel magnetoresistive (TMR) sensors and sensors based on magneto transistors (MT) for an absolute position angle detection in magnetically-polluted environments.

According to an embodiment of the invention the magnetoresistive sensor elements of the Wheatstone bridge are located at positions where within th x-y plane the y-component of the biasing magnetic field is so small that a magnetic saturation of the magnetoresistive sensor elements is prevented. This may provide the advantage that during operation of the described magnetic field sensor system it can be ensured that the magnetoresistive sensor elements are operated within their dynamic ranges and, as a consequence, with high sensitivities. Accordingly, it is advantageous to use a PM design that gives a sufficiently low biasing magnetic field component Hy at locations where the magnetoresistive sensor elements are to be placed.

According to a further embodiment of the invention the magnetoresistive sensor elements are spatially arranged within the x-y-plane in a symmetric manner with respect to the z-axis. This may provide the advantage that the whole magnetic field sensor system can be realized with a highly symmetric design which makes both the theoretical calculation of the performance of the magnetic field sensor system and the realization, i.e. the fabrication, of the magnetic field sensor system easy.

According to a further embodiment of the invention along the y-axis a y-distance (2Δy) between two along the y-axis neighboring magnetoresistive sensor elements is between 0.4 λ and 0.8 λ, wherein λ is the period of the regular structure of teeth and gaps of the circumferential surface of the magnetic wheel. This may provide the advantage that under the provision of not saturating the magnetoresistive sensor elements with too large y-components of the biasing magnetic field (see above) the highest possible differences in the y-component Hy of the biasing magnetic field between corresponding magnetoresistive sensor element positions +Δy and −Δy can be realized. As a consequence, the sensitivity of the magnetic field sensor system will be optimized.

For instance when λ=5 mm, proper distances between the corresponding magnetoresistive sensor elements range from 2 mm to 4 mm. The biasing magnet must thus be made so small that at these locations of the magnetoresistive sensor elements the Hy component is sufficiently small in order to obey the above elucidated requirement of not magnetically saturating the magnetoresistive sensor elements.

According to a further embodiment of the invention the biasing magnet is a multi domain magnet and the y-distance between two along the y-axis neighboring magneetoresisitve sensor elements is smaller than an outer physical dimension of the biasing magnet along the y-axis. In this respect it is mentioned that the distance between two along the y-axis neighboring magnetoresistive sensor elements may also be smaller than 0.4 λ in order to save area of the die carrying all the magnetoresistive sensor elements. Although this might reduce the sensitivity of the magnetic field sensor system the die can be realized in a cheaper manner.

According to a further embodiment of the invention a physical length of the biasing magnet along the y-axis is larger than 2Δy and smaller than 2Δy+4Δ6z. Thereby, 2Δy is a y-distance between two along the y-axis neighboring magnetoresistive sensor elements and Δz is the distance along the z-axis between the x-y plane of the magnetoresistive sensor elements and the biasing magnet.

According to a further embodiment of the invention the biasing magnet is a single permanent magnet. This may provide the advantage that the described magnetic field sensor system with its high sensitivity and its high immunity with respect to external magnetic (stray) fields can be realized with the easiest magnetic arrangement consisting only of one PM.

According to a further embodiment of the invention a physical length of the biasing magnet along the y-axis is larger than 2Δy−4Δz and smaller than 2Δy. Thereby, 2Δy is a y-distance between two along the y-axis neighboring magnetoresistive sensor elements and Δz is the distance along the z-axis between the x-y plane of the magnetoresistive sensor elements and the biasing magnet.

As a rule of thumb, the y-component of the magnetic field Hy vanishes at the positions of the magnetoresistive sensor elements when the distance between these elements is 2Δy=ly+2·Δz. This means that for a biasing magnet with a length of ly=1 mm at a distance of 0.5 mm above the x-y plane of the magnetoresistive sensor elements the distance 2Δy between these elements must be chosen roughly 2 mm for avoiding a magnetic saturation. Further, for a biasing magnet with a length of ly=3 mm the corresponding distance between these elements must be chosen roughly 4 mm. Single magnets with length ly ranging from 1 mm to 3 mm on a distance of 0.5 mm from the x-y plane of the magnetoresistive sensor elements would thus be suitable for a wheel having an above defined periodicity of λ=5 mm.

According to a further embodiment of the invention the single permanent magnet is magnetized along the y-axis. This may provide the advantage that the described magnetic field sensor system can be realized with design for the biasing magnet that obeys the desired symmetry of the y-component of the biasing magnetic field with respect to the y=0 plane.

It can be shown (e.g. by FEM calculations) that when such a type of biasing magnet has a square cross section in the y-z plane, the y-component Hy of the biasing magnetic field of such a biasing magnet has a comparable strength and spatial dependence in the spatial region between the biasing magnet and the magnetic wheel as the z-component Hz of the biasing magnetic field would have for an equal permanent magnetization along the z-axis. Moreover, the asymmetrical effect that displacements of the teeth and gaps have on these fields is also comparable. It is just this asymmetrical effect that is sensed by the described (differential) magnetic field sensor system. This shows that the described (differential) magnetic field sensor system senses approximately the same field differences in Hy as a differential Hall sensor would sense in Hz. However, the advantage of described magnetic field sensor system relying on magnetoresistive sensor elements is its much higher sensitivity which can be fully expressed in the electric response of the described (differential) magnetic field sensor system.

According to a further embodiment of the invention the single permanent magnet is magnetized along a magnetizing direction comprising both a y-component along the y-axis and an x-component along the x-axis.

The provision of a non-zero x-component of the magnetization of the single permanent magnet may have the effect that is each magnetoresistive sensor element an initial magnetization at least partially along the x-axis is provided, which results in an increased stabilization of the initial magnetoresistive sensor element magnetization. As a consequence the magnetic field sensor system will always be present in a defined operational state which in turn determines the sign of its contribution to the output of the Wheatstone bridge. In this respect it is mentioned that changing of the orientation of a barber pole structure within a magnetoresistive sensor element would also change the sign of its contribution.

The required field component along the x-axis can be provided simply by adding an x-component Mx of magnetization to the tingle permanent magnet. It is pointed out that the magnetic field from this magnetization component Mx must not and will not destroy the above described symmetry $Hy(y)=Hy(-y)$ in the x=0 plane because its Hy component is zero in the x=0 plane. At the x=+Δx plane and x=−Δx plane, where the magnetoresistive sensor elements of the Wheatstone bridge are located, its Hy component is unequal zero and shows anti-symmetry $Hy(y)=-Hy(-y)$. Fortunately, the total contribution to the Wheatstone bridge output of the two magnetoresistive sensor elements being located at +Δx counteracts the total contribution of the two magnetoresistive sensor elements being located at −Δx.

It is mentioned that because a common-mode signal arises due to the contributions of above non-zero Hy components, the effect on the output of a differential amplifier arranged downstream with respect to the Wheatstone bridge is only exactly zero when the differential amplifier has an infinitely large common-mode rejection ratio. Practically this will hardly shift the location of the zero points that ideally appears in the middle of each tooth and in the middle of each gap.

It is further mentioned that a stabilizing component Hx of the biasing magnetic field along the x-axis can also be provided by a combination of magnetization components Mx, My and Mz of an arrangement of PMs. It is convenient to make the shape of the PM arrangement symmetric in the x-, the y- and the z-direction. Then, for the desired Hy-field symmetry, $Hy(y)=+Hy(-y)$, to hold everywhere in space, the following PM arrangement design rules should be fulfilled: (i) $Mx(+y)=-Mx(-y)$, (ii) $My(+y)=+My(-y)$, and $Mz(+y)=-Mz(-y)$.

According to a further embodiment of the invention the magnetoresistive sensor elements are oriented in such a manner that their easy axis of magnetization is oriented parallel to the x-axis. This may provide the advantage that a disturbing influence of external homogenous magnetic (stray) fields can be perfectly suppressed while a very good sensitivity of the described magnetic field sensor system can be maintained.

It is mentioned that the described orientations of the magnetoresistive sensor elements can be realized in particular if a longitudinal axis of the magnetoresistive sensor elements, which longitudinal axis defines the direction along which the magnetoresistive sensor elements have their longest extension, is oriented parallel to the x-axis.

According to a further embodiment of the invention the magnetoresistive sensor elements are oriented in such a manner that their easy axis of magnetization is oriented parallel to the biasing magnetic field. In this way it will be possible to ensure that the biasing magnetic field of the biasing magnet will not saturate the magnetoresistive sensor elements.

Also this embodiment may provide the advantage that the influence of external homogenous magnetic (stray) fields can be perfectly suppressed while a very good sensitivity of the described magnetic field sensor system can be maintained. Further, the magnetic field sensor system in accordance with the embodiment described here may provide the advantage that the magnetoresistive sensor arrangement can be realized with a semiconductor die having a comparatively small semiconductor die area, in which the four magnetoresistive sensor elements are formed monolithically. The possibility of keeping the die area small is an important advantage because it has a direct impact on the production costs for the magneetoresisitve sensor arrangement respectively for the whole magnetic field sensor system.

Specifically, compared with known sensor concepts and even compared with the magnetic field sensor system as defined with the preceding embodiments the die area can be reduced by a factor 10-12 with comparable sensitivity. When keeping the die area constant the magnetic field sensor system described with this embodiment can be realized with a 100 times larger sensitivity as compared with the magnetic field sensor system as defined with the preceding embodiments.

As has already been mentioned above the described orientation of the magnetoresistive sensor elements can be realized in particular if a longitudinal axis of the magnetoresistive sensor elements, which longitudinal axis defines the direction along which the magnetoresistive sensor elements have their longest extension, is oriented at least substantially parallel to the local direction of the biasing magnetic field.

According to a further embodiment of the invention the biasing magnet has the geometric form of a rectangular block, wherein a direction of the magnetization of the biasing magnet is parallel to one of the three parallel pairs of faces of the rectangular block. This may provide the advantage that the described magnetic field sensor system can be realized with a very simple form of a permanent magnet.

According to a further embodiment of the invention the sensor arrangement is placed at the center of a face of the biasing magnet, which face is oriented parallel to the direction of the magnetization of the biasing magnet. This may mean in particular that the direction of the easy magnetization axis of the magnetoresistive sensor elements coincides with the direction of the magnetization of the biasing magnet.

The magneetoresisitve sensor elements may be arranged directly at the biasing magnet while maintaining the symmetry of the biasing magnetic field, wherein an y-component of the biasing magnetic field is symmetric with respect to the y=0 plane. This may allow for realizing the described magnetic field sensor system within a small or compact design while maintaining the excellent sensitivity because the biasing magnetic field of the comparatively strong biasing magnet is parallel to the easy axes directions of the magnetoresistive sensor elements. As a consequence, an unwanted saturation of the magnetoresistive sensor elements can be easily avoided.

The spatial dimensions of the biasing magnet may be much larger than the spatial dimension of the magnetoresistive sensor arrangement respectively of the semiconductor die carrying the magnetoresistive sensor elements. Therefore, since the semiconductor die is placed in the centre of the magnet's face, the direction of the easy axis of the magnetoresistive sensor elements is almost perfectly aligned with the direction of the biasing magnetic field. In other words, the magnetic field lines of the biasing magnetic field in the vicinity of the relatively small die will be at least almost parallel to the easy axis of the magnetoresistive sensor elements so that parallel magnetoresistive sensor elements can easily be aligned with the local biasing magnetic fields.

According to a further embodiment of the invention the direction of magnetization of the biasing magnet is 45 degrees with respect to edges of the face of the biasing magnet, which face is oriented parallel to the direction of the magnetization of the biasing magnet. In other words, the magnetization angle of the biasing magnet is 45 degrees with respect to the two axes constituting the face of the magnet onto which the sensor is placed. This may provide the advantage that the performance of the described magnetic field sensor system can be optimized.

The aspects defined above and further aspects of the present invention are apparent from the examples of embodiment to be described hereinafter and are explained with reference to the examples of embodiment. The invention will be described in more detail in the following with reference to examples of embodiment but to which the invention is not limited.

DESCRIPTION OF EMBODIMENTS

The illustration in the drawing is schematically. It is noted that in different figures, similar or identical elements of features are provided with the same reference signs or with reference signs, which are different from the corresponding reference signs only within the first digit. In order to avoid unnecessary repetitions elements or features which have already been elucidated with respect to a previously described embodiment are not elucidated again at a later position of the description.

Figure 1:
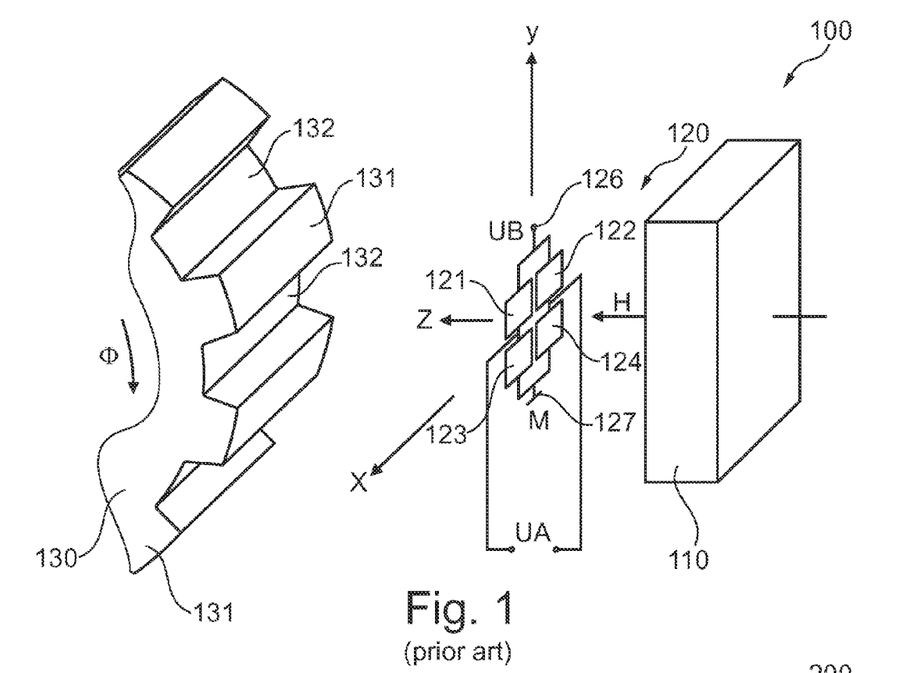
FIG. 1 shows a known magnetic field sensor system for illustrating the basic physical principles of sensing a rotational movement by means of a magnetoresistive sensor arrangement comprising four magnetoresistive sensor elements.

FIG. 1 shows a known magnetic field sensor system 100 for illustrating the basic physical principles of sensing a rotational movement by means of a magnetoresistive sensor arrangement 120 comprising four magnetoresistive sensor elements 121, 122, 123 and 124. As can be seen from FIG. 1, the magnetic field sensor system 100 comprises a biasing magnet 110 producing a biasing magnetic field H, the already mentioned magnetoresistive sensor arrangement 120 and an encoded soft magnetic wheel 130 having a circumferential surface which comprises a regular structure of teeth 131 and gaps 132 arranged in an alternating manner.

The magnetic wheel 130 can be attached to a not depicted shaft, e.g. a camshaft or a crankshaft in a transmission system of a combustion engine. This shaft is oriented along an x-direction. Its corresponding rotation is indicated in FIG. 1 with the curved arrow denominated with the rotational motion coordinate Φ.

The magnetoresistive sensor elements 121, 122, 123, 124, which are arrange on a not depicted silicon substrate (semiconductor die) in a meandering pattern, are configured as a Wheatstone bridge. This Wheatstone bridge is arranged between a first power supply terminal 126, to which in operation a first power supply potential UB is applied, and a second power supply terminal 127, to which in operation a second power supply potential M, preferably ground potential, is applied. The sensor arrangement 120 is planar arranged in an x-y plane defined by an x-axis and a y-axis of an orthogonal Cartesian system of coordinates. A z-axis of the Cartesian system is oriented perpendicular to the x-y plane.

The biasing magnet 110 has a rectangular geometry and is preferably stuck to a rear side of the sensor arrangement 100 or its housing so that the sensor arrangement 100 is permeated by the biasing magnetic field H. The principal direction of the field lines of this biasing magnetic field H extends along the z-axis. The magnetoresistive sensor arrangement 120 has a measuring direction along the y-axis. Along this measuring direction, it is sensitive to the polarity and the field strength of an external magnetic field and is adapted to supply a measuring signal in dependence upon a field component of this magnetic field, denoted as measuring field and measured in the measuring direction. For operation, the external magnetic field is preferably and exclusively formed by the magnetic field H of the biasing magnet 110.

To measure the rotational speed of a shaft by means of the magnetoresistive sensor arrangement 120, the encoded soft magnetic wheel 130 described hereinbefore is positioned in front of the sensor arrangement 120 in the direction of the z-axis. In operation the wheel 130 being formed from a ferromagnetic material which can be magnetized by the biasing magnetic field H rotates in the direction of the motion coordinate Φ. Along the motion coordinate Φ of the magnetic wheel 130, this leads to a distortion of the field lines of the biasing magnetic field H of the biasing magnet 110 in the measuring direction of the sensor arrangement 120, situated in the direction of the y-axis, which distortion occurs periodically with respect to the distance between the teeth 131 or the magnetic wheel 130. The field component of the magnetic field H of the measuring direction situated in the direction of the y-axis is denoted as measuring field.

In the magnetoresistive sensor arrangement 120, the measuring field generates a preferably at least substantially sinusoidal output signal UA via the motion coordinate Φ of the encoded soft magnetic wheel 130.

Figure 2:
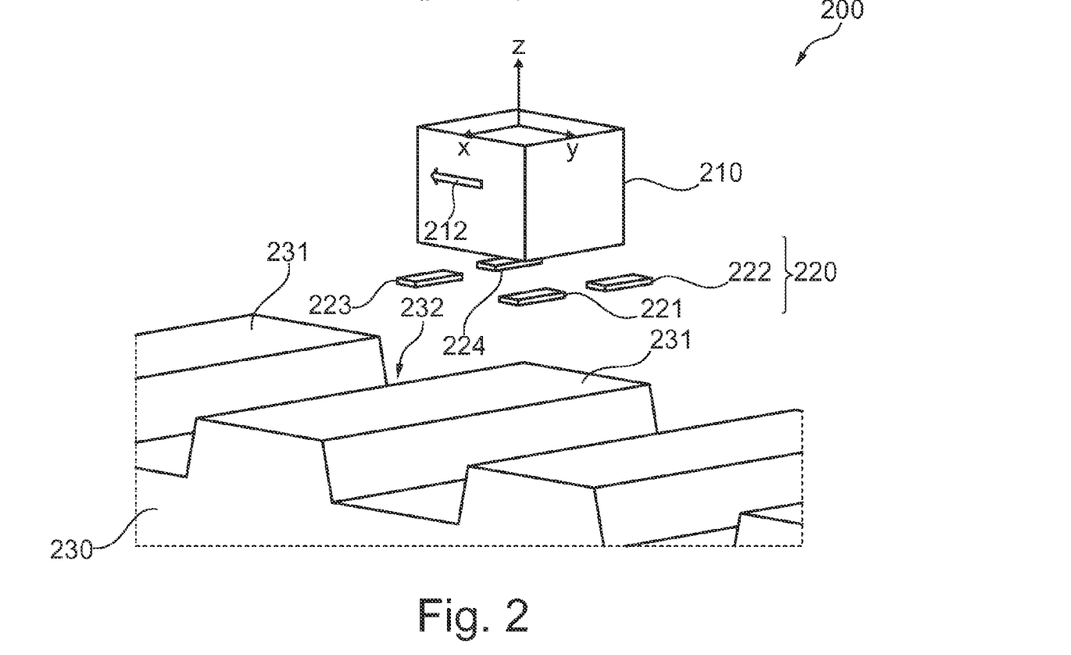
FIG. 2 shows in a perspective view a magnetic field sensor system, wherein in accordance with an embodiment of the invention a biasing magnet produces a biasing magnetic field wherein a y-component of this field is symmetric with respect to the y=0 plane.

FIG. 2 shows in a perspective view a magnetic field sensor system 200, wherein in accordance with an embodiment of the invention a biasing magnet 210 produces a biasing magnetic field wherein a y-component of this field is symmetric with respect to the y=0 plane of an orthogonal Cartesian coordinate system, wherein a z-axis defines a symmetry axis of the whole magnetic field sensor system 200.

In the embodiment described here, the biasing magnet 210 is made from a single permanent magnet (PM) which comprises a magnetization being indicated by the arrow 212. The magnetization 212 is basically aligned with the y-axis. A possible component of the magnetization 212, which is aligned with the x-axis and which is used for stabilizing an initial magnetoresistive sensor element magnetization, is neglected in FIG. 2 for the purpose of clarity of the illustration.

A magnetoresistive sensor arrangement 220 comprising four magnetoresistive sensor elements 221, 222, 223 and 224 is arranged between the biasing magnet 210 and an encoded soft magnetic wheel 230 having a circumferential surface which comprises a regular structure of teeth 231 and gaps 232 arranged in an alternating manner. In accordance with the magnetic field sensor system 100 shown in FIG. 1 also in the magnetic field sensor system 200 shown in FIG. 2 the circumferential surface of the soft magnetic wheel 130 moves along the y-axis.

In an advantageous manner the sensitivity of the magnetic field sensor system 200 for a small rotation around the z-axis is small. This is called low twist sensitivity. Together with the large distance range over which the magnetic field sensor system 200 works accurate this makes the mounting of the magnetic field sensor system 200 in an application very uncritical.

It is mentioned that in FIG. 2 connections between the magnetoresistive sensor elements 221, 222, 223, 224 to let them form a differential Wheatstone bridge and means for biasing and stabilization (e.g. barber poles of the magnetoresistive sensor elements 221, 222, 223, 224) are not shown for the sake of clarity of the illustration.

Figure 3:
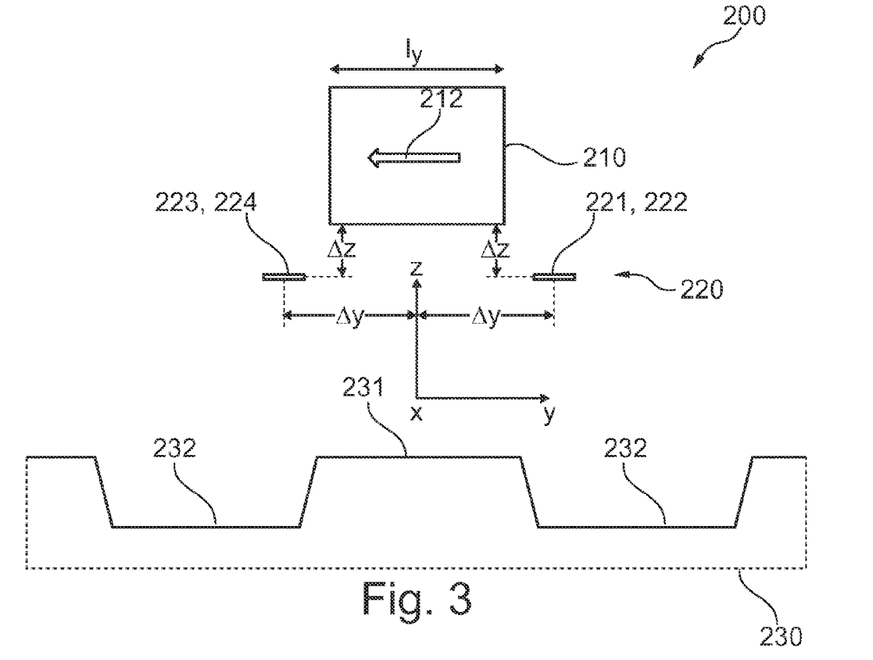
FIG. 3 shows in a cross sectional view the magnetic field sensor system of FIG. 2.

FIG. 3 shows in a cross sectional view the magnetic field sensor system 200. The biasing magnet 210, which has physical length $l_y$ along y-direction, is made from a single PM. Nevertheless, the biasing magnet 210 is capable of producing the required field symmetry of the biasing magnetic field, wherein a y-component of this field is symmetric with respect to the y=0 plane.

The biasing magnet 210, which is a single permanent magnet magnetized in the y-direction, represents the simplest magnet arrangement that obeys the desired symmetry requirements.

It can be shown (e.g. by FEM calculations) that when the biasing magnet 210 has a square cross section in the y-z plane, it's Hy component has comparable strength and spatial dependence between biasing magnet 210 and encoded soft magnetic wheel 230 as the z-component Hz of the biasing magnetic field would have for an equal permanent magnetization along the z-axis. Moreover, the asymmetrical effect that displacements of the teeth 231 and gaps 232 have on these fields is also comparable. It is just this asymmetrical effect that is sensed by the differential magnetic field sensor system 200. This shows that the differential magnetic field sensor system 200 described in this document senses approximately the same field differences in Hy as a differential Hall sensor would sense in Hz. The advantage of the magnetoresistive effect and in particular of AMR effect, namely it's much higher sensitivity than Hall elements, can thus fully be expressed in the response of AMR sensor elements 221, 222, 223, 224.

Care has to be taken, however, that the AMR sensor elements 221, 222, 223, 224 of the Wheatstone bridge are placed at positions where the Hy field is not so high that the AMR sensor elements 221, 222, 223, 224 become magnetically saturated and consequently loose their high sensitivity. It is therefore important for AMR sensors systems (and GMR or TMR sensor systems as well) to use a biasing magnet design that gives sufficiently low field component Hy at locations where the AMR sensor elements 221, 222, 223, 224 are to be placed. For the highest possible difference in Hy between the sensor element positions +Δy and −Δy, it is advisable to choose the distance between the elements 2Δy between 0.4 λ and 0.8 λ, with λ the period of the tooth-gap structure of the wheel 230. When λ=5 mm, proper distances between the elements thus range from 2 mm to 4 mm. In case of the single biasing magnet, this magnet must thus be made so small that at these locations of the AMR sensor elements 221, 22, 223, 224 the Hy component is sufficiently small. As a rule of thumb, the field Hy vanishes at the element positions when between the sensor elements 221, 222, 223, 224 there is a distance 2Δy=ly+2Δz, where Δz is the distance from the x-y plane of the AMR sensor elements 221, 222, 223, 224 to the biasing PM 210. This means for a biasing PM 210 with a length of ly=1 mm at a distance of 0.5 mm above the sensor arrangement 220 that the distance between the AMR sensor elements 221, 222, 223, 224 must be chosen roughly 2 mm for avoiding magnetic saturation. For a magnet with a length of ly=3 mm the distance between the AMR sensor elements 221, 222, 223, 224 must be chosen roughly 4 mm. Single magnets with length ly ranging from 2 mm to 4 mm on a distance of 0.5 mm from the sensors would thus be suitable for an encoded soft magnetic wheel 230 with λ=5 mm.

It is mentioned that in FIG. 3 permanent magnetization components in particular along the x-direction for stabilizing and for biasing the AMR sensor elements 221, 222, 223, 224 are not shown.

Figure 4:
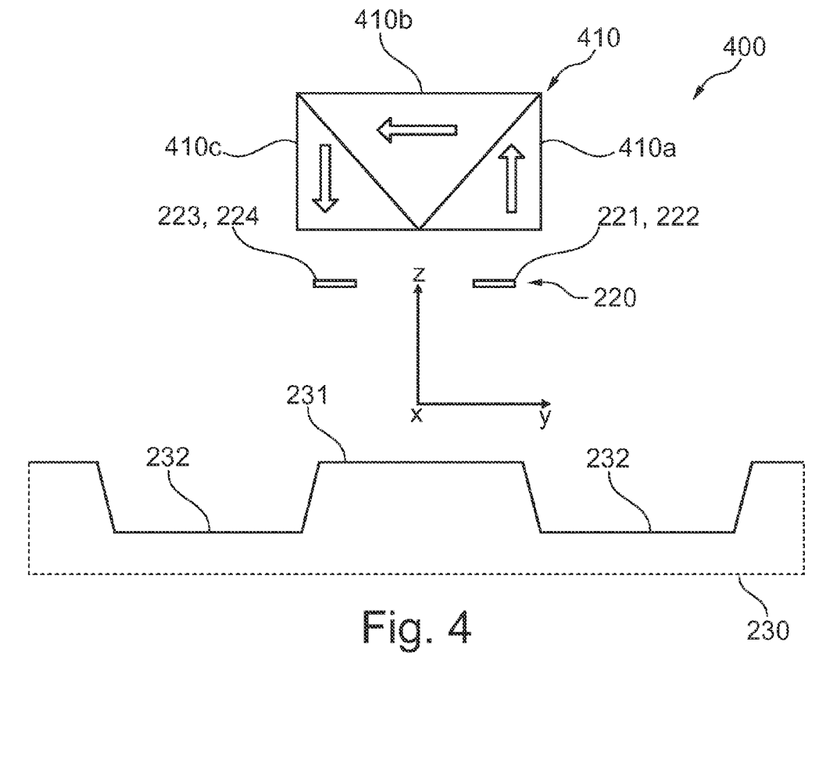
FIG. 4 shows in a cross sectional view a magnetic field sensor system comprising a biasing magnet which has different magnetization domains and which also produces the required field symmetry of the biasing magnetic field, wherein a y-component of this field is symmetric with respect to the y=0 plane.

FIG. 4 shows in a cross sectional view a magnetic field sensor system 400 comprising a biasing magnet 410 which also produces the required field symmetry of the biasing magnetic field, wherein a y-component of this field is symmetric with respect to the y=0 plane. By contrast to the biasing magnet 210 shown in FIGS. 2 and 3, the biasing magnet 410 has three different spatial domains each having its own magnetization direction. Specifically, as can be seen from FIG. 4, a first domain 410a has a direction of magnetization along the positive z-direction, a second domain 410b has a direction of magnetization along the negative y-direction and the third domain 410c has a direction of magnetization along the negative z-direction. Due to the realization of a magnetic flux closure on the upper side of the biasing magnet 410, the field on the lower side of the biasing magnet 410 is increased. The field on the upper side of the biasing magnet 410 is strongly reduced.

It is mentioned that also in FIG. 4 permanent magnetization components in particular along the x-direction for stabilizing and for biasing the AMR sensor elements 221, 222, 223, 224 are not shown.

Figure 5:
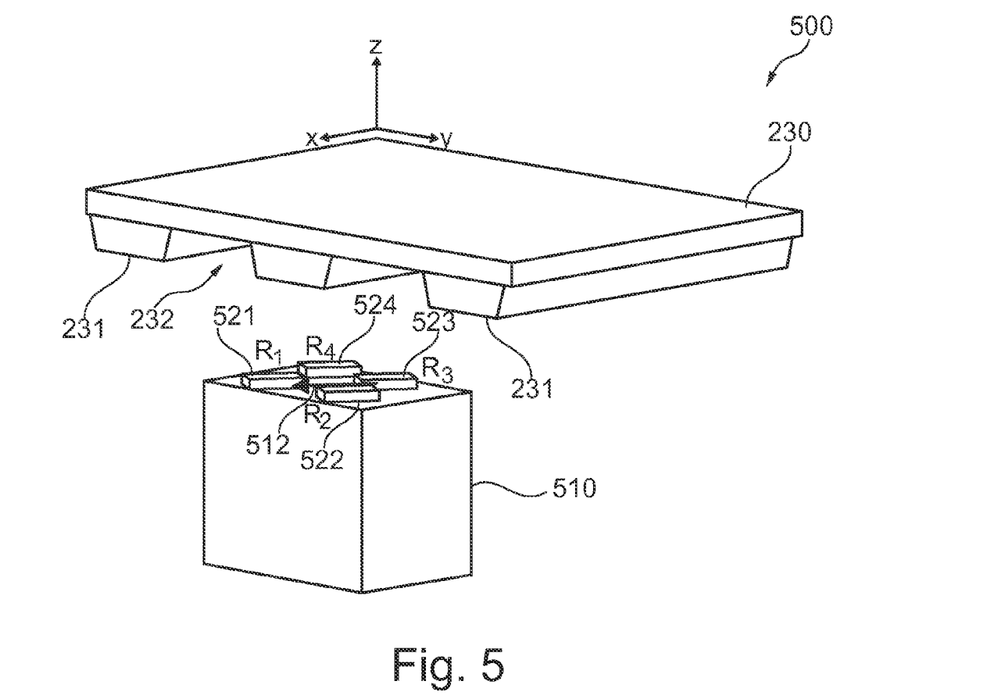
FIG. 5 shows in a perspective view a further magnetic field sensor system, wherein four magnetoresistive sensor elements are attached to a face of the biasing magnet and wherein the magnetoresistive sensor elements are oriented in such a manner that their easy axis of magnetization is oriented parallel to the biasing magnetic field.

FIG. 5 shows in a perspective view a further magnetic field sensor system 500, wherein four magnetoresistive sensor elements 521, 522, 523, 524 are attached to a face of the biasing magnet 510 in such a manner that the magnetoresistive sensor elements 521, 522, 523, 524 are oriented with their easy axis of magnetization parallel to the biasing magnetic field. According to the embodiment described here the entirety of the magnetoresistive sensor elements 521, 522, 523, 524, which are electrically connected together in the form of a Wheatstone bridge, is attached to the center of the upper face of the biasing magnet 510. Further, a direction of magnetization 512 of the biasing magnet 510 forms an angle of 45 degrees with respect to the edges of the upper face. With this relative orientation between the direction of magnetization 512 and the edge of the upper face the performance of the magnetic field sensor system 500 will be optimized.

The dimensions of the biasing magnet 510 are much larger than the dimension of a semiconductor die carrying the four magnetoresistive sensor elements 521, 522, 5223, 524. In this respect it is mentioned that FIG. 5 is not drawn to scale. Therefore since the semiconductor die is placed in the center of the upper face of the biasing magnet 510, the direction of the easy axis of magnetization of th magnetoresistive sensor elements 521, 522, 523, 524 almost perfectly coincides with direction of magnetization of the biasing magnet 510.

In order to summarize: The sensor concept shown in FIG. 5 has the advantages that the magnetic field sensor system 500 (a) is not sensitive to external homogeneous magnetic fields, (b) generates zero signal at the symmetrical positions of the encoded magnetic wheel 230, (c) has reasonable sensitivity, (d) can be realized with small dimensions of a semiconductor die carrying the magnetoresistive sensor elements 521, 522, 523 and 524, and (e) is easy to package and trim.

Figure 6:
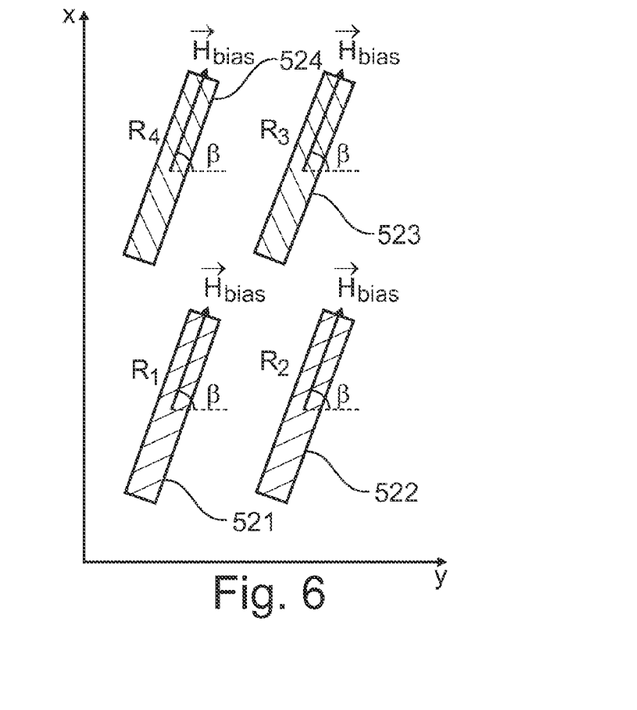
FIG. 6 illustrates for each magnetoresistive sensor element the alignment of the easy axis of magnetization with the biasing magnetic field.

In the following it will be explained with reference to FIG. 6 why it is advantageous if the easy axis of magnetization of each magnetoresistive sensor element 521, 522, 523, 524 should be aligned with the direction of the biasing magnetic field, which in FIG. 6 is denoted with $H_{bias}$. As can be seen from FIG. 6 showing that the magnetoresistive sensor element 521, 522, 523, 524 are arranged in a planar manner within the x-y plane, the angle between biasing magnetic field $H_{bias}$ and the y-axis is denoted with β.

A normal component of the biasing magnetic field $H_{bias}$ (with respect to the east axis of magnetization of each magnetoresistive sensor element 521, 522, 523, 524) can saturate the respective magnetoresistive sensor element 521, 522, 523, 524 such that it will be less sensitive. By choosing the magnetoresistive sensor elements 521, 522, 523, 524 aligned with the direction of the biasing magnetic field $H_{bias}$ the requirement to place the magnetoresistive sensor elements 521, 522, 523, 524 at a location where the biasing magnetic field $H_{bias}$ is small or zero disappears. This offers the possibility to substantially reduce the area of the semiconductor die onto which the four magnetoresistive sensor elements 521, 522, 523, 524 are formed. Hence the die can be made much smaller than in the embodiments shown in the FIGS. 2, 3 and 4 of this document. Further, it will be easier to package the magnetic field sensor system 500, which has further the advantage that is will generate a zero output signal at symmetrical positions of the encoded soft magnetic wheel 130.

The remaining question regarding the performance of the magnetic field sensor system 500 concerns its sensitivity. Although, the sensitivity of a magnetic field sensor system type described in this document increases as a function of the distance between the different magnetoresistive sensor elements, the sensitivity rises quicker for the magnetic field sensor system 500 than for the magnetic field sensor systems 200 and 400 shown in FIGS. 2, 3 and 4, because for the magnetic field sensor systems 200 and 400 the sensitivity is too low near the center of the face of the biasing magnet, since at that place the magnetoresistive sensor elements would be (nearly) saturated.

Figure 7:
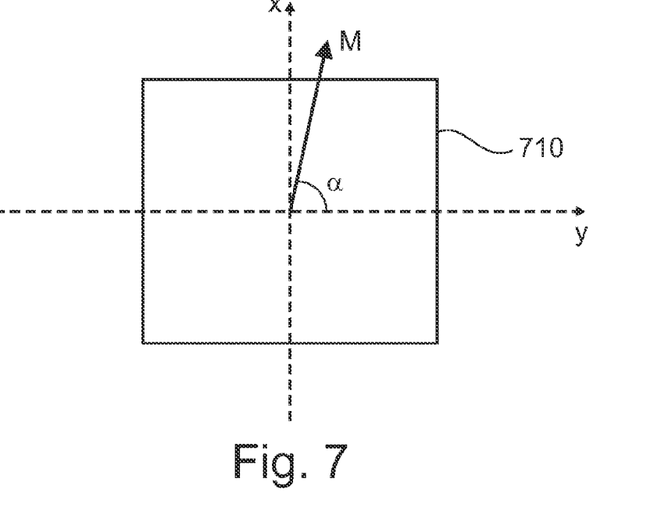
FIG. 7 illustrates a biasing magnet having a magnetization vector which lies in the x-y plane and which forms an angle α with the y-axis.

The sensitivity of the sensors according to the invention can be optimized as explained below with reference to FIG. 7, which illustrates a biasing magnet 710 having a magnetization vector M which lies in the x-y plane and which forms an angle α with the y-axis.

The sensitivity depends on the direction of the magnetization of the biasing magnet. In order to study this dependency, first the field of the passive encoded soft magnetic wheel at the center of the magnetoresistive sensor arrangement comprising the four magnetoresistive sensor elements is denoted by $\vec{H}^x$ if the magnetization of the biasing magnet would have only an x-component with a value $M_0$. In other words, with respect to the y-axis the magnetization angle α=π/2 (see FIG. 7). The vector field $\vec{H}^x$ depends on the position of the magnetic wheel and the length of the air gap extending between the x-y plane of the magnetoresistive sensor arrangement and the biasing magnet. From symmetry considerations one can see that for any position of the magnetic wheel the vector $\vec{H}^x=(H_x^x, 0,0)$, i.e. this vector $\vec{H}^x$ has only one nonzero component.

Similarly, $\vec{H}^y$ will denote the field of the magnetic wheel at the center of the magnetoresistive sensor arrangement if the biasing magnet is magnetized exclusively in the y-direction with the strength $M_0$. This corresponds to the magnetization angle α=0 (see FIG. 7). In this case The field $\vec{H}^y$ has two nonzero components: $\vec{H}^y=(0,H_y^y,H_z^7)$, whereby because of symmetry reasons $H_z^y=0$ for any symmetrical position of the magnetic wheel.

Finally, $\vec{H}$ will denote the field of the magnetic wheel at the at the center of the magnetoresistive sensor arrangement if the biasing magnet is magnetized exclusively in the z-direction with the strength $M_0$. The field $\vec{H}^z$ has also two nonzero components: $\vec{H}^z=(0,H_y^z,H_z^z)$. Here also, as in the case of $\vec{H}^y$, the field $H_y^z=0$ for any symmetrical position of the magnetic wheel.

In case of a magnetic field sensor system 500 as shown in FIG. 5, the magnetization vector of the biasing magnetic field lies in the x-y plane. Finding the optimum direction of the magnetization vector is equivalent to the determination of the angle α from FIG. 7.

Assuming that the norm of the magnetization of the biasing magnet does not depend on its direction and this norm is equal to $M_0$, one can express the field of the encoded magnetic wheel for any magnetization direction in the following way:

$$\vec{H}^{wheel}=(\sin(\alpha)H_x^x,\ \cos(\alpha)H_y^y,\ \cos(\alpha)H_z^y).$$

For the orientation of a semiconductor die shown in FIG. 5, the corresponding magnetic field sensor system 500 is sensitive only to the first x-component and to the second y-component of the field of the magnetic wheel because a magnetoresistive sensor element is only sensitive to the magnetic fields in the x-y plane of the sensor element. That is why the field of the magnetic wheel can be described as a two dimensional vector.

Figure 8:
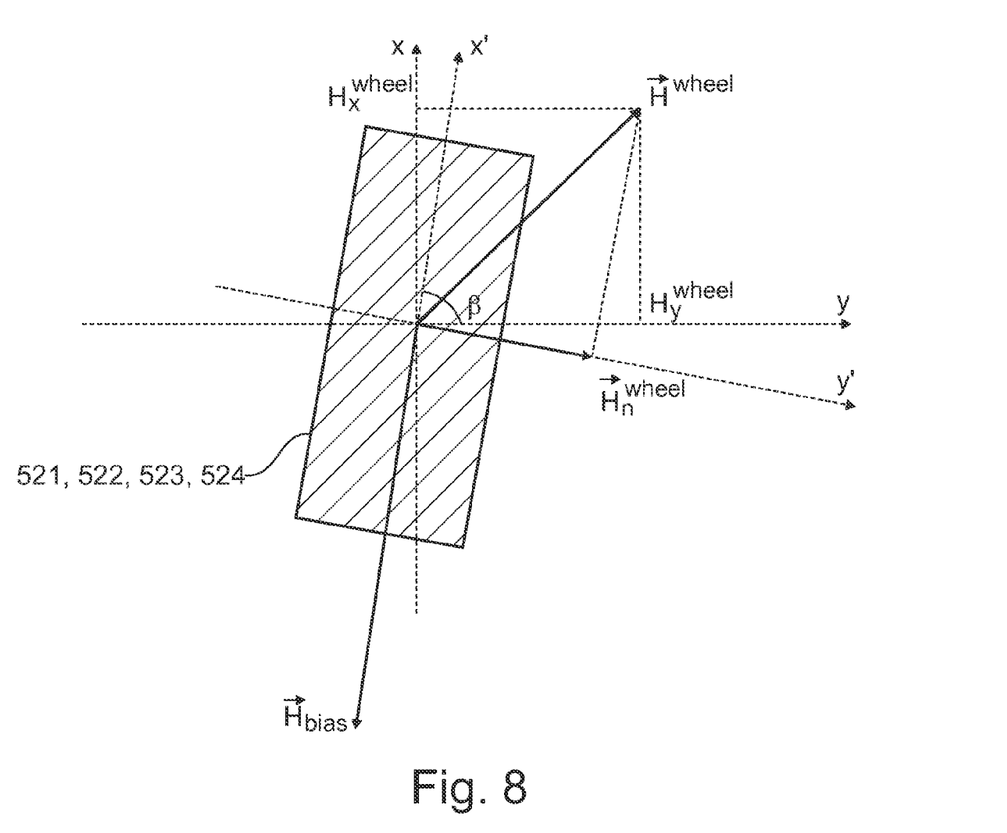
FIG. 8 illustrates a relationship between a global coordinate system and a local coordinate system, wherein the global coordinate system (x, y, z) is aligned with the geometry of the biasing magnet and the local coordinate system (x', y', z') is aligned with the geometrics of the magnetoresistive sensor elements.

FIG. 8 illustrates a relationship between a global coordinate system (x, y, z) and a local coordinate system (x', y', z'), wherein the global coordinate system is aligned with the geometry of the biasing magnet and the local coordinate system is aligned with the geometry of the respective magnetoresistive sensor element.

In the local coordinate system (x', y') of the magnetoresistive sensor element the magnetic field of the encoded magnetic wheel has the following components:

$$\begin{pmatrix} H_{x'}^{wheel} \\ H_{y'}^{wheel} \end{pmatrix} = \begin{pmatrix} \cos(\frac{\pi}{2}-\beta) & \sin(\frac{\pi}{2}-\beta) \\ -\sin(\frac{\pi}{2}-\beta) & \cos(\frac{\pi}{2}-\beta) \end{pmatrix} \begin{pmatrix} \sin(\alpha)H_x^x \\ \cos(\alpha)H_y^y \end{pmatrix} =$$

$$\begin{pmatrix} \sin(\beta) & \cos(\beta) \\ -\cos(\beta) & \sin(\beta) \end{pmatrix} \begin{pmatrix} \sin(\alpha)H_x^x \\ \cos(\alpha)H_y^y \end{pmatrix} = \begin{pmatrix} H_x^x\sin(\alpha)\sin(\beta)+H_y^y\cos(\alpha)\cos(\beta) \\ H_y^y\cos(\alpha)\sin(\beta)-H_x^x\sin(\alpha)\cos(\beta) \end{pmatrix}$$

Here $\beta$ is the angle between easy axis of magnetization of the respective sensor element and the y-axis (see FIG. 8). Since in accordance with the embodiment of the invention described here the direction of the easy axis of magnetization for each sensor element must be aligned with the direction of the biasing magnetic field, the angel $\beta$ is a function of the magnetization angle $\alpha$ (see FIG. 7). In case the semiconductor die carrying the magnetoresistive sensor elements is placed in the center of the main face of the biasing magnet, the dimensions of the magnet are much larger than the dimensions of the die and if the main face is a square, it can be derived that because of symmetry and linearity reasons $\beta$ and $\alpha$ must be equal ($\beta=\alpha$). In this case the previous equation can be rewritten as:

$$\vec{H}^{wheel} = \begin{pmatrix} H_x^x\sin^2(\alpha)+H_y^y\cos^2(\alpha) \\ (H_y^y-H_x^x)\sin(\alpha)\cos(\alpha) \end{pmatrix}$$

This means that the normal component of the magnetic field of the passive encoder wheel (with respect to the easy axis of magnetization of the magnetoresistive sensor element) is equal to $H_{hu\ wheel}=\sin(\alpha)\cos(\alpha)(H^y-H^x)$.

The output value of the magnetic field sensor system 500 increases with an increase of the normal component of the magnetic field of the encoded magnetic wheel. That is why the highest sensitivity of the magnetic field sensor system 500 can be obtained if the magnetization angle $\alpha=\pi/4$. In this case the normal component of $H_n^{wheel}$ will have its highest value $\frac{1}{2}(H_y^y-H_x^x)$.

In case the main face of the biasing magnet is not square or a semiconductor die carrying the four magnetoresistive senor elements is not placed in its center, the angle $\beta$ will be different from the angle $\alpha$ ($\beta(\alpha)\neq\alpha$). In this case, for any given dimensions of the biasing magnet and for a given place of the semiconductor die, $\beta(\alpha)$ can be calculated analytically or with the help of FEM simulations. This means that the optimum value for $\alpha$ may be different from $\pi/4$. In any case it will be possible to find this optimum value for $\alpha$.

Figure 9A:
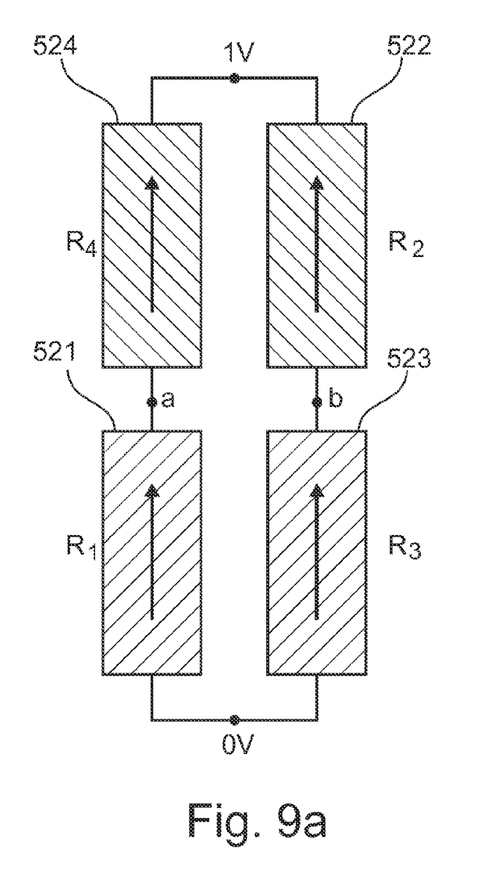
FIGS. 9a and 9b illustrate two possible electrical layouts of the magnetoresistive sensor arrangement, which differ from each other by a different barber pole orientation.
Figure 9B:
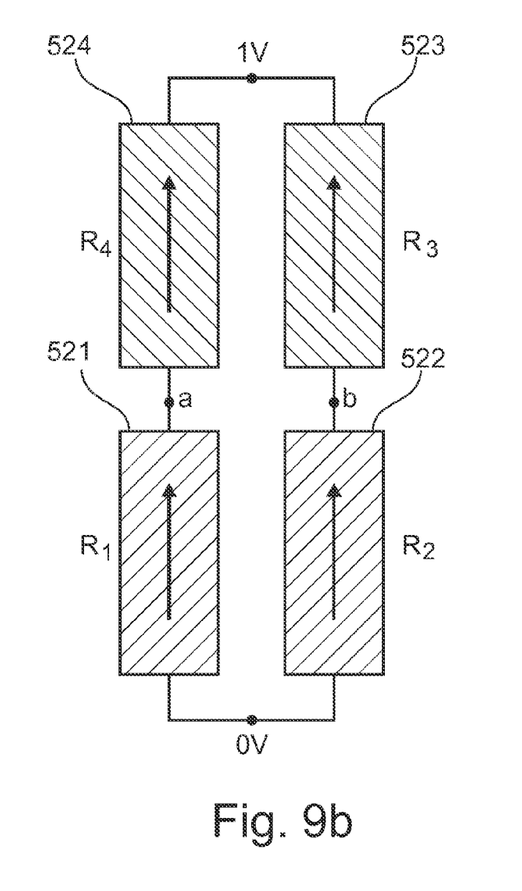

FIGS. 9a and 9b illustrate two possible electrical layouts of the magnetoresistive sensor arrangement comprising the four magnetoresistive sensor elements 521, 522, 523 and 524. These different electrical layouts, which can be obtained simply by electrically connecting the four sensor elements 521, 522, 523 and 524 being formed on a semiconductor die in a different manner, differ from each other by a different barber pole orientation of the two magnetoresistive sensor elements 522 and 523.

According to the embodiment described here the easy axis of magnetization of each magnetoresistive sensor element 521, 522, 523, 524, which easy axis corresponds to the lengthy extension of the respective sensor element 521, 522, 523 524, is aligned with the biasing magnetic field (indicated in FIGS. 9a and 9b with thick arrows). The orientation of barber poles (indicated in FIGS. 9a and 9b by the inclined hatchings) ensures that the output signal of the sensor does not depend on an unwanted external magnetic (stray) field.

At the symmetrical positions of the encoded magnetic wheel, because of the symmetric arrangement of the magnetoresistive sensor elements 521, 522, 523, 524 shown in FIG. 5, the total magnetic field at the senor elements 521 ($R_1$) and 523 ($R_3$) is equal. The same is true for the magnetoresistive sensor elements 522 ($R_2$) and 524 ($R_4$). This means that the output signal of the sensor with the layouts shown in FIGS. 9a and 9b at the symmetrical positions of the encoded magnetic wheel will be zero.

The last step in building the magnetic field sensor system 500 is placing the encoded magnetic wheel made from a soft magnetic material above the biasing magnet 510 (see FIG. 5).

Figure 10A:
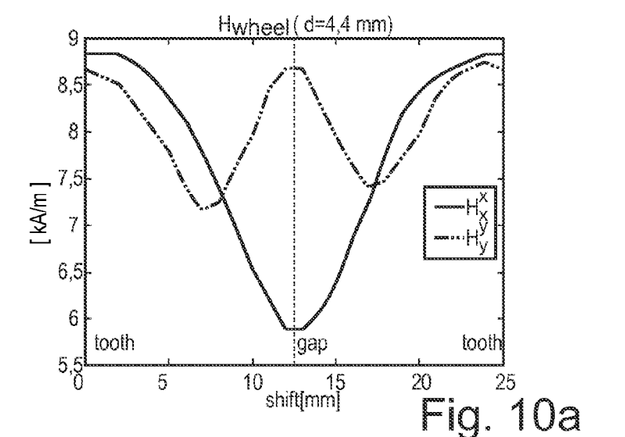
FIGS. 10a, 10b and 10c show results of experiments measuring the magnetic field of an encoded soft magnetic wheel in the presence of a biasing magnet as a function of the rotational position of the wheel for different orientations of the magnetization of the biasing magnet.
Figure 10B:
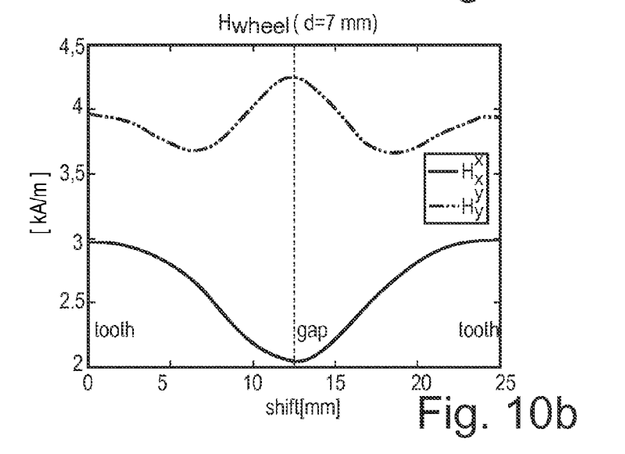
Figure 10C:
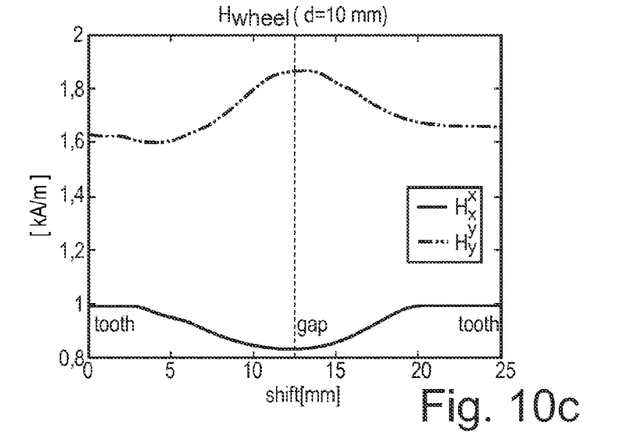

FIGS. 10a, 10b and 10c show results of experiments measuring the magnetic field of an encoded soft magnetic wheel in the presence of a biasing magnet as a function of the rotational position of the wheel for different orientations of the magnetization of the biasing magnet. The full lines show the magnetic field in the unit kA/m for a magnetization direction of the biasing magnet exclusively along the x-direction ($M_0$,0,0). The dotted lines show the magnetic field in the unit kA/m for a magnetization direction of the biasing magnet exclusively along the y-direction (0,$M_0$,0). The measurements results shown in FIG. 10a have been obtained by a distance d of 4.4 mm between the encoded magnetic wheel and the biasing magnet. The measurements results shown in FIG. 10b have been obtained by a distance d of 7 mm between the encoded magnetic wheel and the biasing magnet. The measurements results shown in FIG. 10c have been obtained by a distance d of 10 mm between the encoded magnetic wheel and the biasing magnet.

All experiments were performed with a setup where all dimensions (size of the biasing magnet, distance d (air gap) between the encoded magnetic wheel and the biasing magnet and the size of the encoded magnetic wheel are approximately 3 times bigger than in the reality.

It should be noted that the term "comprising" does not exclude other elements or steps and "a" or "an" does not exclude a plurality. Also elements described in association with different embodiments may be combined. It should also be noted that reference signs in the claims should not be construed as limiting the scope of the claims.

Reference Numerals 100 magnetic field sensor system
110 biasing magnet
120 magnetoresistive sensor arrangement 121 magnetoresistive sensor element
122 magnetoresistive sensor element
123 magnetoresistive sensor element
124 magnetoresistive sensor element
126 first power supply terminal
130 encoded soft magnetic wheel
131 tooth/teeth
132 gap
H biasing magnetic field
Φ rotational motion coordinate/direction of rotational of shaft
x x-axis/x-direction
y y-axis/y-direction
z z-axis/z-direction
UA output signal
UB first power supply potential
M second power supply potential
200 magnetic field sensor system
210 biasing magnet
212 magnetization/direction of magnetization
220 magnetoresistive sensor arrangement
221 magnetoresistive sensor element
222 magnetoresistive sensor element
223 magnetoresistive sensor element
224 magnetoresistive sensor element
230 encoded soft magnetic wheel
231 tooth/teeth
232 gap
$l_y$ physical length of biasing magnet along y-direction
400 magnetic field sensor system
410 biasing agent
410a first domain of biasing magnet 410
410b second domain of biasing magnet 410
410c third domain of biasing magnet 410
500 magnetic field sensor system
510 biasing magnet
512 magnetization/direction of magnetization
521 magnetoresistive sensor element
522 magnetoresistive sensor element
523 magnetoresistive sensor element
524 magnetoresistive sensor element
710 biasing magnet
M magnetization vector

The invention claimed is:

1. A magnetic field sensor system for measuring rotational movements of a shaft, the magnetic field sensor system comprising:
a biasing magnet configured for generating a biasing magnetic field;
a magnetic wheel having a wheel axis and a circumferential surface which comprises a regular structure of teeth and gaps arranged in an alternating manner, wherein
the magnetic wheel is attachable to the shaft and
the magnetic wheel is magnetizable by the biasing magnetic field; and
a magnetoresistive sensor arrangement comprising four magnetoresistive sensor elements being connected with each other in a Wheatstone bridge, respectively two of the magnetoresistive sensor elements being assigned to one half bridge of the Wheatstone bridge, wherein the four magnetoresistive sensor elements are arranged within an x-y plane, wherein an x-axis, a y-axis and a z-axis define an orthogonal Cartesian coordinate system in which the x-axis is oriented parallel with the wheel axis of the magnetic wheel, the y-axis is oriented tangential to the circumferential surface of the magnetic wheel, and the z-axis is the symmetry line through the center of the biasing magnet and the center of the magnetic wheel;
wherein the biasing magnet is configured in such a manner that the y-component of the biasing magnetic field is symmetric with respect to the y=0 plane, wherein the biasing magnet is a multi domain magnet and the y-distance between two along the y-axis neighboring magnetoresistive sensor elements is smaller than an outer physical dimension of the biasing magnet along the y-axis.

2. The magnetic field sensor system as set forth in claim 1, wherein the magnetoresistive sensor elements of the Wheatstone bridge are located at positions where within the x-y plane the y-component of the biasing magnetic field is so small that a magnetic saturation of the magnetoresistive sensor elements is prevented.

3. The magnetic field sensor system as set forth in claim 1, wherein the magnetoresistive sensor elements are spatially arranged within the x-y-plane in a symmetric manner with respect to the z-axis.

4. The magnetic field sensor system as set forth in a claim 1, wherein along the y-axis a y-distance between two along the y-axis neighboring magnetoresistive sensor elements is between 0.4λ and 0.8λ, wherein λ is the period of the regular structure of teeth and gaps of the circumferential surface of the magnetic wheel.

5. The magnetic field sensor system as set forth in claim 1, wherein a physical length of the biasing magnet along the y-axis is larger than 2Δy and smaller than 2Δy+4Δz, wherein
2Δy is a y-distance between two along the y-axis neighboring magnetoresistive sensor elements and
Δz is the distance along the z-axis between the x-y plane of the magnetoresistive sensor elements and the biasing magnet.

6. The magnetic field sensor system as set forth in claim 1, wherein the biasing magnet is a single permanent magnet.

7. The magnetic field sensor system as set forth in claim 6, wherein the single permanent magnet is magnetized along the y-axis.

8. The magnetic field sensor system as set forth in claim 6, wherein the single permanent magnet is magnetized along a magnetizing direction comprising both a y-component along the y-axis and an x-component along the x-axis.

9. The magnetic field sensor system as set forth in claim 1, wherein a physical length of the biasing magnet along the y-axis is
larger than 2Δy−4Δz and smaller than 2Δy, wherein
2Δy is a y-distance between two along the y-axis neighboring magnetoresistive sensor elements and
Δz is the distance along the z-axis between the x-y plane of the magnetoresistive sensor elements and the biasing magnet.

10. The magnetic field sensor system as set forth in claim 1, wherein the magnetoresistive sensor elements are oriented in such a manner that their easy axis of magnetization is oriented parallel to the x-axis.

11. The magnetic field sensor system as set forth in claim 10, wherein the direction of magnetization of the biasing magnet is 45 degrees with respect to the edges of the face of the biasing magnet, which face is oriented parallel to the direction of the magnetization of the biasing magnet.

12. The magnetic field sensor system as set forth in claim 1, wherein the magnetoresistive sensor elements are oriented in such a manner that their easy axis of magnetization is oriented parallel to the biasing magnetic field.

13. The magnetic field sensor system as set forth in claim 12, wherein the biasing magnet has the geometric form of a rectangular block, wherein a direction of the magnetization of the biasing magnet is parallel to one of the three parallel pairs of faces of the rectangular block.

14. The magnetic field sensor system as set forth in claim 12, wherein the sensor arrangement is placed at the center of a face of the biasing magnet, which face is oriented parallel to the direction of the magnetization of the biasing magnet.

15. A magnetic field sensor system for measuring rotational movements of a shaft, the magnetic field sensor system comprising:
   a biasing magnet configured for generating a biasing magnetic field;
   a magnetic wheel having a wheel axis and a circumferential surface which comprises a regular structure of teeth and gaps arranged in an alternating manner, wherein
   the magnetic wheel is attachable to the shaft and
   the magnetic wheel is magnetizable by the biasing magnetic field; and
   a magnetoresistive sensor arrangement comprising four magnetoresistive sensor elements being connected with each other in a Wheatstone bridge, respectively two of the magnetoresistive sensor elements being assigned to one half bridge of the Wheatstone bridge, wherein the four magnetoresistive sensor elements are arranged within an x-y plane, wherein an x-axis, a y-axis and a z-axis define an orthogonal Cartesian coordinate system, wherein a physical length of the biasing magnet along the y-axis is larger than $2\Delta y$ and smaller than $2\Delta y + 4\Delta z$, wherein $2\Delta y$ is a y-distance between two along the y-axis neighboring magnetoresistive sensor elements and $\Delta z$ is the distance along the z-axis between the x-y plane of the magnetoresistive sensor elements and the biasing magnet.

16. A magnetic field sensor system for measuring rotational movements of a shaft, the magnetic field sensor system comprising:
   a biasing magnet configured for generating a biasing magnetic field;
   a magnetic wheel having a wheel axis and a circumferential surface which comprises a regular structure of teeth and gaps arranged in an alternating manner, wherein
   the magnetic wheel is attachable to the shaft and
   the magnetic wheel is magnetizable by the biasing magnetic field; and
   a magnetoresistive sensor arrangement comprising four magnetoresistive sensor elements being connected with each other in a Wheatstone bridge, respectively two of the magnetoresistive sensor elements being assigned to one half bridge of the Wheatstone bridge, wherein the four magnetoresistive sensor elements are arranged within an x-y plane, wherein an x-axis, a y-axis and a z-axis define an orthogonal Cartesian coordinate system wherein a physical length of the biasing magnet along the y-axis is larger than $2\Delta y - 4\Delta z$ and smaller than $2\Delta y$, wherein $2\Delta y$ is a y-distance between two along the y-axis neighboring magnetoresistive sensor elements and $\Delta z$ is the distance along the z-axis between the x-y plane of the magnetoresistive sensor elements and the biasing magnet.

* * * * *